March 10, 1970 D. P. THURNELL 3,500,223
VARIABLE GAIN AMPLIFIER CIRCUITS
Filed Dec. 8, 1967
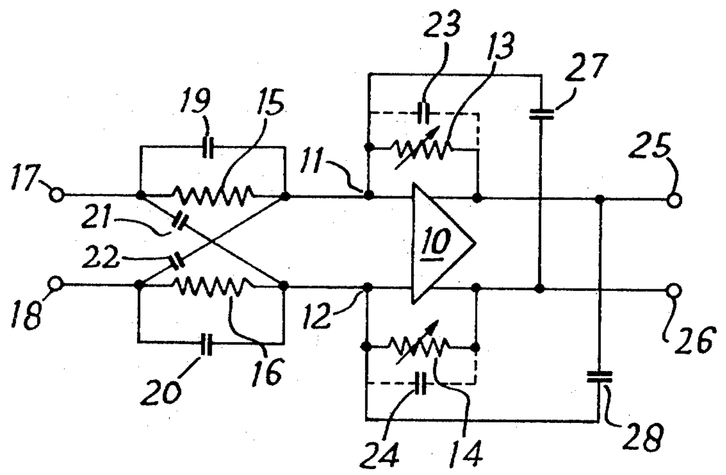
INVENTOR
DUNCAN PHILIP THURNELL
BY
Woodhams, Blanchard & Flynn
ATTORNEYS

United States Patent Office 3,500,223
Patented Mar. 10, 1970

3,500,223

VARIABLE GAIN AMPLIFIER CIRCUITS

Duncan P. Thurnell, 66 Hornsey Rise, London, N. 19, England

Filed Dec. 8, 1967, Ser. No. 689,180
Claims priority, application Great Britain, Dec. 15, 1966, 56,239/66
Int. Cl. H03f *3/68, 1/34*
U.S. Cl. 330—30 5 Claims

ABSTRACT OF THE DISCLOSURE

A variable-gain operational amplifier circuit in which a differential amplifier provided with variable feedback impedances has its two input terminals respectively connected through two input impedances to two circuit input terminals, and a balanced capacitive bridge is so connected between the circuit-input terminals and the differential amplifier input terminals that the bridge does not pass any signal applied to both circuit-input terminals to the differential amplifier.

The present invention relates to differential amplifiers connected in operational amplifier circuits.

According to the present invention, an operational amplifier circuit includes a differential amplifier having a first amplifier-input terminal connected to a first circuit-input terminal by way of a first input impedance, and a second amplifier-input terminal connected to a second amplifier-input terminal by way of a second input impedance, a first feedback impedance connected between a first amplifier-output terminal and the first amplifier-input terminal, a second feedback impedance connected between a second amplifier-output terminal and the second amplifier-input terminal, and a balanced capacitive bridge with one pair of opposite corners at the circuit-input terminals and the other pair of opposite corners at the amplifier-input terminals, whereby a single applied to the circuit-input terminals cannot pass by way of the bridge to the amplifier-input terminals.

The input and feedback impedances may, of course, be input and feedback resistors. The bridge may be made up of four capacitors, the first and second capacitors being connected between the first circuit-input terminal and the first amplifier-input terminal, and between the second circuit-input terminal and the second amplifier-input terminal, respectively, and the third and fourth capacitors being connected between the first circuit-input terminal and the second amplifier-input terminal, and between the second circuit-input terminal and the first amplifier-input terminal, respectively.

One advantage of the present invention is that by choosing capacitors for the bridge circuit the amplifier circuit can be given a desired input capacity to provide, for example, a controlled terminating impedance for a circuit connected to the amplifier circuit. For instance the probe of an oscilloscope often includes a capacitive voltage divider part of which may be the input capacity of the amplifier circuit.

Since any signal applied to the input capacity will not appear at the input terminals of the differential amplifier there is no need to use other capacitors connected for example across the feedback resistors to ensure that the amplifier circuit has a "flat" frequency response. This is a great advantage where gain is to be varied since such other capacitors would have to be variable, to be changed when the resistance of the feedback resistors is changed to vary gain.

Using an operational amplifier has the advantage that a variable gain amplifier can be provided with fixed and therefore equal input resistances for each of the inputs to the differential amplifier. The resulting balanced input provides good common-mode rejection, that is rejection of a signal applied between each circuit-input terminal simultaneously and common terminal, usually earth. Operational amplifiers can also be made with high input resistances, for example 1 MΩ, and this is useful in displaying small signals on an oscilloscope.

Constructing the aforementioned bridge by using capacitors connected across the input resistors is also advantageous since it reduces the noise bandwidth of noise generated in the input resistors and applied to the differential amplifier. This noise can be considerable in comparison with a low input signal since as explained above the input resistors may have an impedance of 1 MΩ or more. Noise bandwidth is reduced because the differential amplifier input is effectively shunted by the capacitors across the input resistors for all frequencies which make the impedances of the shunt capacitors low in comparison with the input resistors. Since the amplifier-input terminals in an operational amplifier are virtual earths, the capacitors connected from the circuit-input terminal of one input to the amplifier-input terminal of the other input can be considered as being in parallel with the input resistor of the said one input, and noise reduction is the same as would be obtained if instead of the bridge, two capacitors of twice the capacity of the bridge capacitors were connected separately across the input resistors, one for each input resistor.

An embodiment of the invention will now be described by way of example with reference to the accompanying drawing which shows a part-circuit part-block diagram of an amplifier circuit according to the present invention.

A differential amplifier 10 having two input terminals 11 tnd 12 is connected as an operational amplifier with two variable feedback resistors 13 and 14, and two input resistors 15 and 16. The gain of the amplifier circuit can be changed by varying the resistors 13 and 14. The input of the circuit, as seen at two circuit-input terminals 17 and 18, is balanced by choosing equal high resistances for the resistors 15 and 16.

A balanced bridge is constructed from four equal capacitors 19, 20, 21 and 22 of capacity C. Hence the capacitive component of the input admittance at the terminals 17 and 18 is $\omega C$, at an angular frequency $\omega$ if any other capacities the circuit may have are ignored. This capacitative component can, of course, be given a desired value by the choice of value of the capacitors 19 to 22. Since the bridge is balanced, any signal applied to the terminals 17 and 18 which form one pair of opposite corners of the bridge will not appear, by way of the bridge, at the amplifier-input terminals 11 and 12 which form the other pair of opposite corners of the bridge. Thus the gain of the amplifier does not change with frequency due to the input capacity provided by the bridge and there is no need to use for the bridge variable capacitors which can be changed when the the amplifier gain is changed. However, it may be that stray capacities 23 and 24 which exist between the amplifier-input terminals 11 and 12 and amplifier-output terminals 25 and 26 are significant in reducing gain at high frequencies. If so, capacitors 27 and 28, of equal capacity to capacities 23 and 24, respectively, connected to pass feedback signals of opposite phase to the signals passed by capacities 23 and 24, may be used to cancel the effect of these stray capacities.

I claim:

1. An operational amplifier circuit comprising:

(a) a differential amplifier, (b) first and second circuit-input terminals, (c) first and second amplifier-input terminals of the differential amplifier, (d) a first input impedance connecting the first circuit-input terminal to the first amplifier-input terminal, (e) a second input impedance connecting the second circuit-input terminal to the second amplifier-input terminal, (f) first and second amplifier-output terminals, (g) a first feedback impedance connected between the first amplifier-output terminal and the first amplifier-input terminal, (h) a second feedback impedance connected between the second amplifier-output terminal and the second amplifier-input terminal, and (i) a balanced capacitive bridge with one pair of opposite corners respectively at the circuit-input terminals and the other pair of opposite corners respectively at the amplifier-input terminals.

2. An operational amplifier circuit as claimed in claim 1, wherein the said bridge consists of four capacitors of which a first capacitor is connected between the said first circuit-input terminal and the said first amplifier-input terminal, a second capacitor is connected between the said second circuit-input terminal and the said second amplifier-input terminal, a third capacitor is connected between the said first circuit-input terminal and the said second amplifier-input terminal, and a fourth capacitor is connected between the said second circuit-input terminal and the said first amplifier-input terminal.

3. An operational amplifier as claimed in claim 1, wherein a first feedback capacitor is connected between the said first amplifier-output terminal and the said second amplifier-input terminal, and a second feedback capacitor is connected between the said second amplifier-output terminal and the said first amplifier-input terminal.

4. A variable-gain operational amplifier circuit comprising:

(a) a differential amplifier, (b) first and second circuit-input terminals, (c) first and second amplifier-input terminals of the differential amplifier, (d) a first input resistor connecting the first circuit-input terminal to the first amplifier-input terminal, (e) a second input resistor connecting the second circuit-input terminal to the second amplifier-input terminal, (f) first and second amplifier-output terminals, (g) a first variable feedback resistor connected between the first amplifier-output terminal and the first amplifier-input terminal, (h) a second variable feedback resistor connected between the second amplifier-output terminal and the second amplifier-input terminal, (i) a first capacitor connected between the first circuit-input terminal and the first amplifier-input terminal, (j) a second capacitor connected between the second circuit-input terminal and the second amplifier-input terminal, (k) a third capacitor connected between the first circuit-input terminal and the second amplifier-input terminal, and (l) a fourth capacitor connected between the second circuit-input terminal and the first amplifier-input terminal, the four capacitors constituting a balanced bridge.

5. A variable-gain operational amplifier as claimed in claim 4, wherein stray capacitance existing between the said amplifier-input terminals and the said amplifier-output terminals are connected by two further balancing capacitors to form a further capacitive bridge of which one pair of opposite corners are respectively at the said amplifier-input terminals and the other pair of opposite corners are respectively at the said amplifier output-terminals.

References Cited

UNITED STATES PATENTS

| | | | |
|---|---|---|---|
| 3,089,097 | 5/1963 | Bell | 330—9 |
| 3,237,002 | 2/1966 | Patmore | 330—103 X |
| 3,344,283 | 9/1967 | Stubbs | 307—230 |

NATHAN KAUFMAN, Primary Examiner

U.S. Cl. X.R.

330—103, 185